(12) United States Patent
Mullins et al.

(10) Patent No.: US 8,544,745 B2
(45) Date of Patent: Oct. 1, 2013

(54) HEAT-DISSIPATING CARD CONNECTOR

(75) Inventors: Gregory Loyd Mullins, Atlanta, GA (US); Chi-Lun Lin, Taipei (TW); Zhuo Chen, Guang Dong (CN)

(73) Assignee: Genesis Technology USA, Inc., Norcross, GA (US)

( * ) Notice: Subject to any disclaimer, the term of this patent is extended or adjusted under 35 U.S.C. 154(b) by 0 days.

(21) Appl. No.: 13/247,396

(22) Filed: Sep. 28, 2011

(65) Prior Publication Data

US 2012/0325908 A1   Dec. 27, 2012

Related U.S. Application Data

(60) Provisional application No. 61/448,914, filed on Mar. 3, 2011.

(51) Int. Cl.
*H01R 13/00* (2006.01)

(52) U.S. Cl.
USPC ........... 235/451; 235/439; 235/441; 439/485; 439/487; 361/688; 361/704; 361/709; 361/711

(58) Field of Classification Search
USPC .................................................. 235/451, 492
See application file for complete search history.

(56) References Cited

U.S. PATENT DOCUMENTS

| | | | |
|---|---|---|---|
| 3,268,772 A | 8/1966 | Kamei et al. | |
| 4,542,784 A | 9/1985 | Welsh | |
| 4,945,401 A * | 7/1990 | Trunk et al. | 257/718 |
| 5,653,610 A | 8/1997 | Broschard, III | |
| 5,667,397 A | 9/1997 | Broschard, III et al. | |
| 5,967,845 A * | 10/1999 | Ho et al. | 439/607.33 |
| 6,283,376 B1 | 9/2001 | Schuder et al. | |
| 6,382,995 B1 | 5/2002 | Bricaud et al. | |
| 6,672,514 B1 | 1/2004 | Brennan et al. | |
| 6,802,448 B2 | 10/2004 | Bricaud et al. | |
| 6,984,140 B2 | 1/2006 | Juret et al. | |
| 7,350,705 B1 | 4/2008 | Frederick et al. | |
| 7,675,748 B2 | 3/2010 | Matsushima et al. | |
| 2008/0280482 A1 | 11/2008 | Huang | |
| 2011/0130029 A1* | 6/2011 | Yoshida et al. | 439/485 |

FOREIGN PATENT DOCUMENTS

WO     WO 2010001816 A1 *  1/2010

OTHER PUBLICATIONS

International Search Report dated Mar. 27, 2012 in PCT/US2011/063114.

* cited by examiner

*Primary Examiner* — Christopher Stanford
(74) *Attorney, Agent, or Firm* — Hope Baldauff, LLC

(57) ABSTRACT

This disclosure is directed to apparatuses, systems, and methods associated with a heat-dissipating card connector for use with a card reader connected to an electronic device. The connector has a body configured to receive a card that has circuitry, when the card is inserted into the card reader. The connector body includes a plurality of electronic contacts that engage the card circuitry and operationally link the card to the electronic device. The connector body includes at least one heat conductive spring that includes a card engaging portion. The card engaging portion contacts the card and directs heat from the card when the card is inserted in the card reader. A heat directing element, also part of the heat conductive spring, transfers heat from the card engaging portion to a heat-dissipating structure of the electronic device when the card is inserted in the card reader.

11 Claims, 8 Drawing Sheets

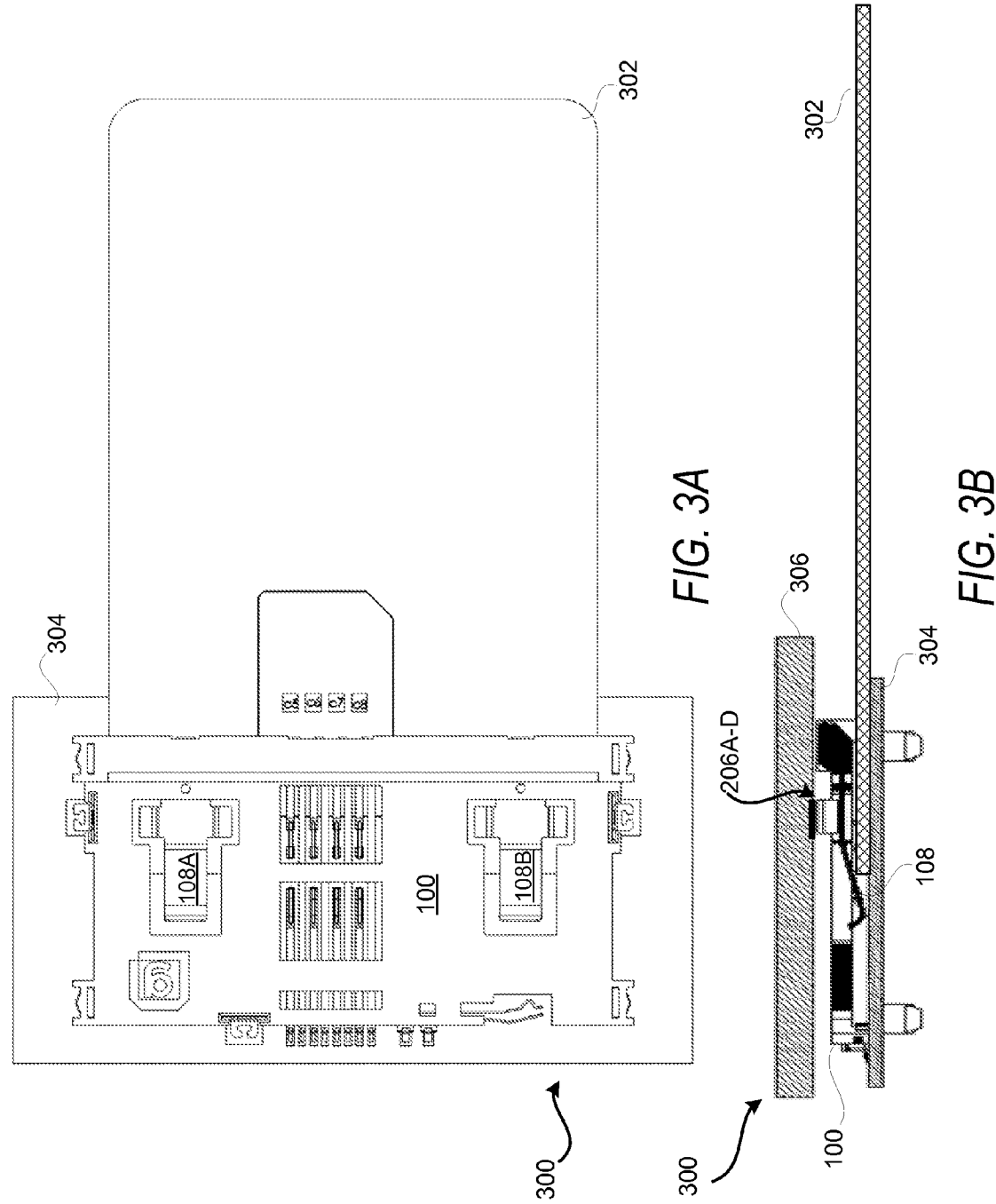

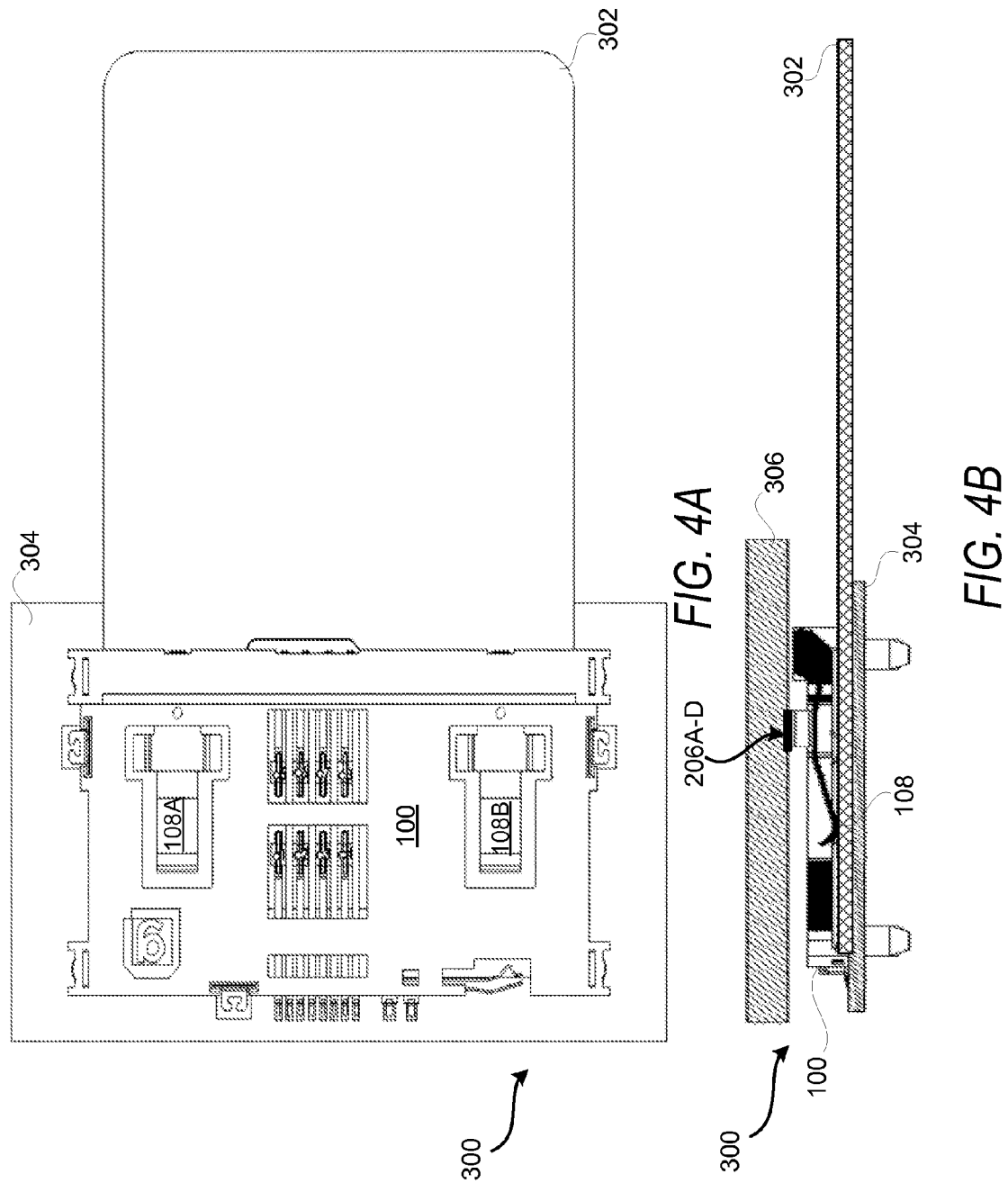

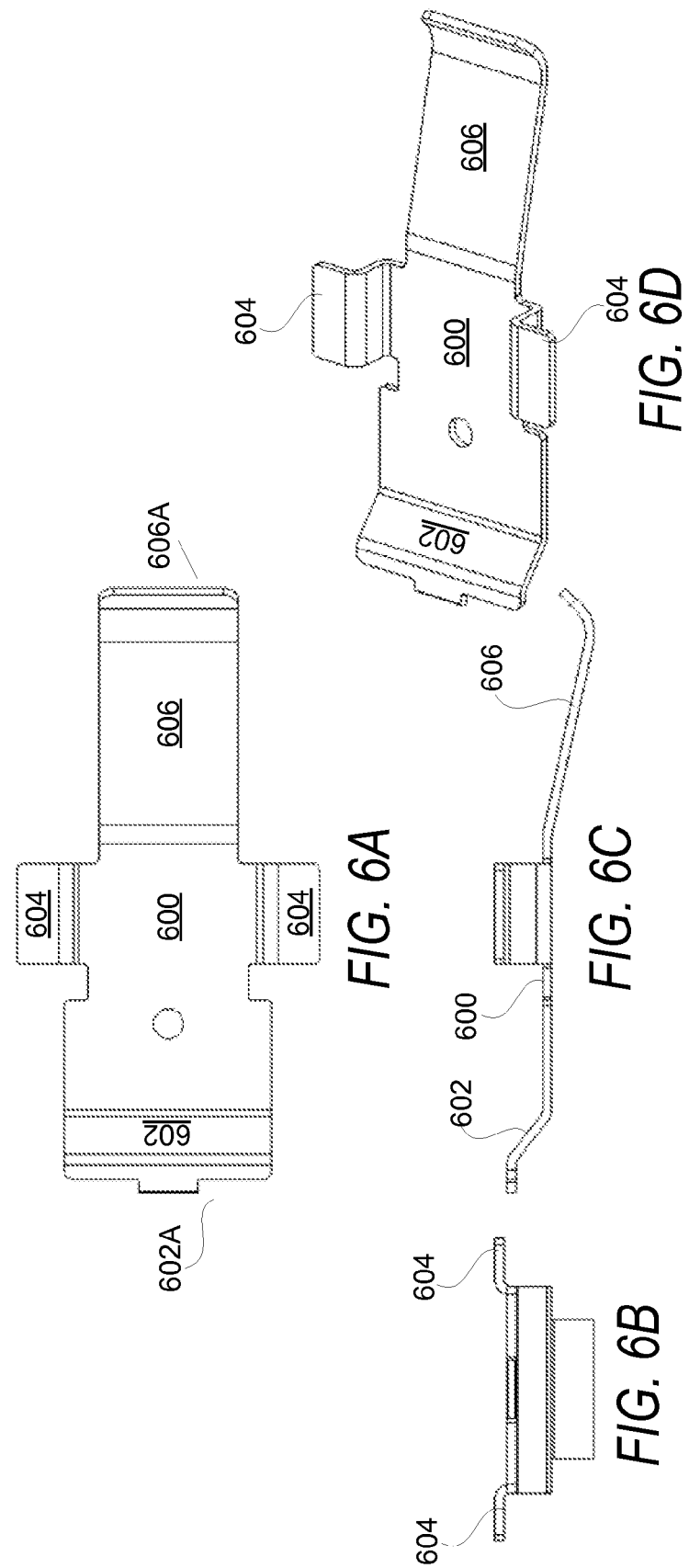

HEAT-DISSIPATING CARD CONNECTOR

CROSS-REFERENCE TO RELATED APPLICATION

This application claims the benefit of U.S. Provisional Patent Application No. 61/448,914, filed Mar. 3, 2011, which is expressly incorporated herein by reference in its entirety.

BACKGROUND

Smart cards are utilized in various types of electronic devices to provide authentication and other types of functionality. For instance, satellite television receivers typically include a smart card reader. Satellite television subscribers are issued a smart card which, when inserted into the card reader in an appropriate satellite television receiver, will allow the subscriber to be authenticated as an authorized user of the television service.

Smart cards typically include embedded integrated circuits. When inserted into an appropriate card reader, power is applied to the smart card thereby powering the embedded integrated circuits. The integrated circuits embedded on a smart card can generate significant heat, especially when utilized in small passively cooled electronic devices, such as set-top boxes.

It is with respect to these considerations and others that the disclosure made herein is presented.

SUMMARY

A heat-dissipating card reader is disclosed herein. The heat-dissipating card reader disclosed herein can dissipate heat generated by a smart card or other type of approximately credit card sized card with embedded electronics. According to one aspect, the heat-dissipating card reader disclosed herein can transmit, transfer, and dissipate heat generated by a smart card to the chassis or case of the electronic device within which the heat-dissipating card reader is mounted.

According to one aspect, a card connector is provided herein that includes a body constructed from a non-conductive material, such as plastic. The body is formed in a shape suitable for mounting on an electronic circuit board and for receiving a credit card shaped card, such as a smart card, a chip card, or an integrated chip card ("ICC") that includes embedded electronics. The body has a set of conductive electronic contacts molded therein that are configured for operationally mating or linking with a card inserted into the card reader. The contacts may be connected to suitable electronic contacts on the circuit board to which the card reader is mounted.

According to another aspect, the card reader also includes one or more heat conductive springs. The heat conductive springs are at least partially constructed from a suitable material that is heat transmitting or heat dissipating, such as metals or alloys, and are molded into the body of the card reader. In one implementation, the heat conductive springs include a main body, a card engaging portion, a chassis engaging portion, and a body engaging portion. The body engaging portion is molded into the body of the smart card reader. The card engaging portion extends downward from the body of each heat conductive spring and makes contact with a card inserted into the card reader. The chassis engaging portion extends upward from the body of the heat conductive spring.

When a card is inserted into the card reader provided herein, the card makes contact with the card engaging portion of the one or more heat conductive springs, thereby deflecting the body and the chassis engaging portion of the heat conductive spring toward a chassis or case of the electronic device in which the card reader is mounted. Heat generated by the card is thereby dissipated to the heat conductive springs and to the case or chassis of the electronic device housing the card reader. A heat transfer compound, such as thermal grease, may be applied to the chassis engaging portion of each heat conductive spring to facilitate the transfer of heat to the chassis or case of an electronic device.

An embodiment of a heat-dissipating card reader taught herein includes a heat-dissipating card connector attached to a mounting surface of an electronic device. The heat-dissipating card connector includes a body that is configured to receive a card, and is communicatively coupled or otherwise electronically connected to the electronic device. The body includes a plurality of electronic contacts that extend from the body and contact the card circuitry when the card is inserted into the card reader. The body also includes at least one heat conductive spring that extends from the body, which contacts the card when the card is inserted into the card reader. The heat conductive spring directs heat from the card to a heat-dissipating structure of the electronic device.

An embodiment of a heat-dissipating card connector taught herein includes a connector body mounted to and electronically connected or otherwise electronically linked to a printed circuit board of an electronic device. The connector body is configured to receive a card that has electronics or embedded circuitry, when the card is inserted into a card reader. The connector body includes a plurality of electronic contacts that operationally engage the card circuitry and electronically connect or otherwise link the card circuitry to the printed circuit board. The heat-dissipating card connector also includes at least one heat conductive spring attached to the connector body, which includes a card engaging portion that contacts the card and directs heat from the card when the card is operationally engaged to the card reader. A heat directing element, which is also a part of the heat conductive spring, transfers heat from the card engaging portion to a heat-dissipating structure of the electronic device, when the card is operationally engaged to the card reader.

An embodiment of a heat conductive spring for use with a card reader is likewise taught herein. The heat conductive spring includes a thermally conductive spring body, and a connector body engaging portion that extends from one end of the spring body and is attached to a connector body. The heat conductive spring also includes a thermally conductive card contacting portion, which extends from another end of the thermally conductive spring body and is configured to frictionally engage a card inserted into the card reader and transmit heat from the card to the thermally conductive spring body. Further, the heat conductive spring also includes at least one heat-dissipating element integral to the thermally conductive spring body that is configured to transfer heat from the thermally conductive spring body to a heat-dissipating structure within an electronic device.

A method of constructing a heat-dissipating card connector for use with a card reader is another embodiment taught herein. This method teaches providing a connector body configured to receive a card that has electronics or embedded circuitry, that is configured to be attached to a mounting surface, and that is configured to be electronically connected or otherwise electronically linked to an electronic device. This method further includes attaching a plurality of electronic contacts to the connector body so that the card circuitry may be operationally engaged or otherwise accessed when the card is inserted into the card reader. This method also includes attaching at least one heat conductive spring to the connector body. The heat conductive spring has a body engaging portion attached to the connector body, a thermally conductive card engaging portion that contacts the card and directs heat from the card when the card is operationally engaged to the card reader, and a heat directing element that transfers heat from the thermally conductive card engaging portion to a heat-dissipating structure of the electronic device.

It should be appreciated that the above-described subject matter may also be implemented as an electrical apparatus, a manufacturing process, an electrical and mechanical system, or as an article of manufacture. The features, functions, and advantages that have been discussed can be achieved independently in various embodiments of the present disclosure or may be combined in yet other embodiments, further details of which can be seen with reference to the following Detailed Description and Drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 3A-3B are top and side views, respectively, of an exemplary heat-dissipating card reader having a card partially inserted therein.

FIGS. 4A-4B are top and side views, respectively, of an exemplary heat-dissipating card reader having a card fully inserted therein.

FIGS. 6A-6F are perspective views of exemplary heat conductive springs utilized in an embodiment of a card reader.

DETAILED DESCRIPTION

Figure 1:
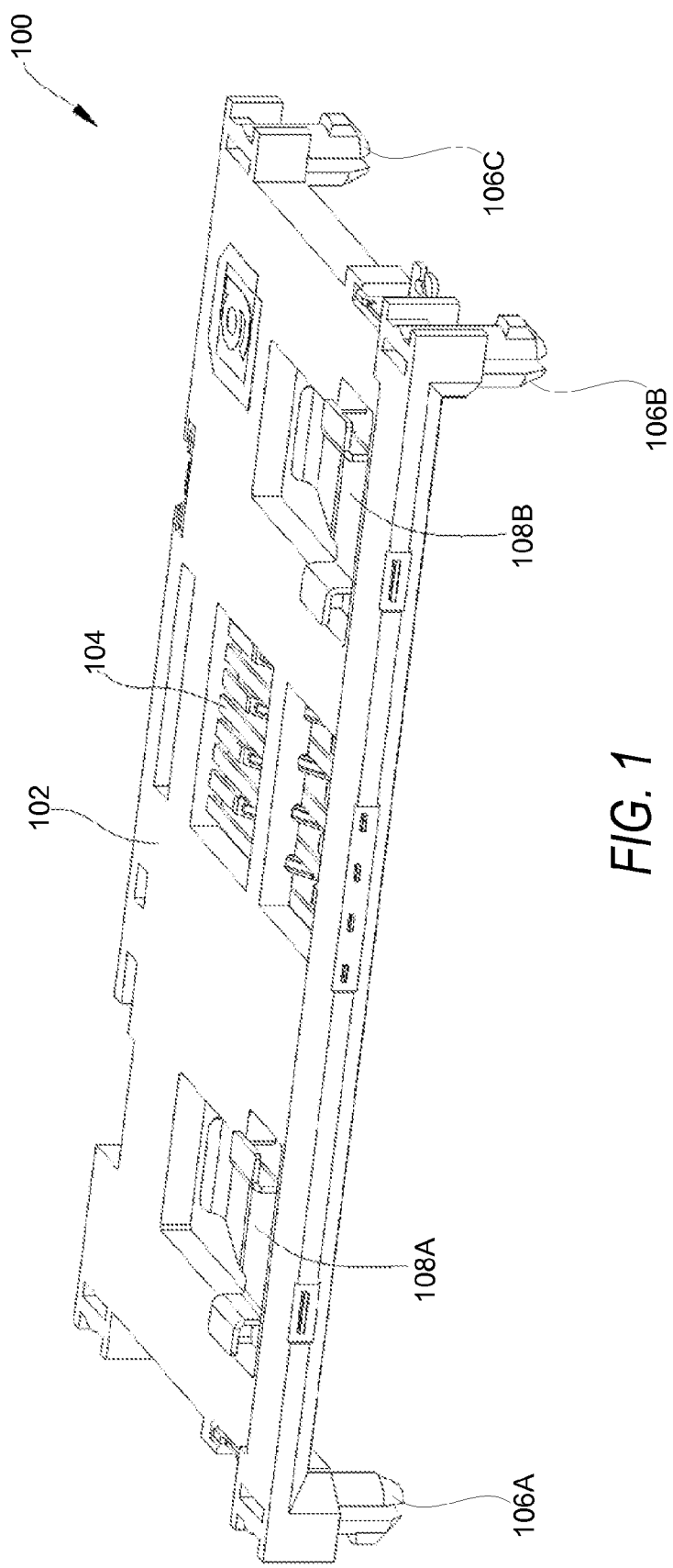
FIG. 1 is a perspective diagram showing an exemplary heat-dissipating card connector.

The following Detailed Description is directed to technologies for a heat-dissipating card connector and a heat-dissipating card reader. The heat-dissipating card reader embodiments disclosed herein can dissipate heat generated by a smart card or other type of card that includes embedded electronics or circuitry. In particular, in one implementation the heat-dissipating card reader disclosed herein can dissipate heat generated by a smart card to a heat-dissipating structure, such as a platform, chassis, or case of the electronic device within which the heat-dissipating card reader is mounted.

In the following Detailed Description, references are made to the accompanying drawings that form a part hereof, and which are shown by way of illustrated embodiments or examples. Referring now to the drawings, in which like numerals represent like elements through the several figures, aspects of apparatus, system, and methodology for a heat-dissipating card reader will be described.

FIG. 1 is a perspective diagram showing various aspects of an exemplary heat-dissipating card connector 100 (herein "card connector 100") disclosed herein. As shown in FIG. 1, the illustrated card connector 100 includes a body 102 constructed primarily of a molded thermoplastic, such as but not limited to HDPE or PCT. In some embodiments the body 102 might be constructed from other types of non-conductive materials or composites, such as but not limited to ceramic. In alternative embodiments the body 102 may include integral or attached elements that are conductive, in that those elements may conduct electrical current or heat.

The card connector 100 shown in FIG. 1 might also be utilized in and communicatively coupled to any type of electronic device that might receive and obtain data from a card, such as but not limited to an ATM, a vending machine, a point of sale device, combinations thereof, and the like. It should be appreciated that while the card connector 100 disclosed herein is generally described in the context of a substantially planar smart card, chip card, ICC card, combinations thereof and the like, the card connector 100 elements might be shaped for connecting, coupling, linking, or engaging any type of device comprising circuitry or embedded electronics from which data may be retrieved (herein "card" 302 best shown in FIGS. 3A-3B).

The body 102 is sized and configured such that it can receive a card or other type of card device, when attached to a mounting surface and communicatively coupled or operationally engaged to the circuitry of an electronic device, such as a printed circuit board. For instance, the card connector 100 may be attached to a mounting surface that is a printed circuit board in a satellite television receiver and configured to receive a smart card for authenticating television services. In alternative embodiments the card connector 100 is attached to a mounting surface that is a heat-dissipating structure, such as a platform, chassis, or case, and is otherwise communicatively coupled or electronically linked to a printed circuit board.

According to one embodiment, the body 102 includes a plurality of engaging members, shown here as posts 106 molded with and integral to the body 102. The posts 106 are configured for insertion into appropriately located holes in a mounting surface, such as a printed circuit board, platform, chassis, or case. The posts 106 may include a tab or boss, or other mechanisms for securing the card connector 100 to the mounting surface. Other types of engaging mechanisms or fasteners, such as solder nails (204A-204C, best shown in FIG. 2), might also be utilized to attach the card connector 100 to a mounting surface.

As shown in FIG. 1, the body 102 also has at least one set of resilient conductive electronic contacts 104, attached to or integrally molded to the body 102, which are configured to communicatively couple or otherwise operationally engage with the electronic circuitry of the card inserted into the card connector 100. The electronic contacts 104 may be connected to suitable electronic contacts on the printed circuit board to which the card connector 100 is communicatively coupled.

The card connector 100 also includes one or more heat conductive springs 108A-108B. As will be described in greater detail below, the heat conductive springs 108A-108B are configured to make contact with a card inserted into the card connector 100 and to transmit, transfer, or dissipate heat generated by the card. Heat may be transmitted by the heat conductive springs 108A-108B themselves and may also be dissipated to a heat-dissipating surface, such as a platform, chassis, or case of an electronic device within which the card connector 100 is installed. It should be appreciated that although two heat conductive springs 108A-108B are shown in FIG. 1, one or more heat conductive springs 108A-108B may be utilized in other embodiments. Additional details regarding the construction and use of the card connector 100 and the heat conductive springs 108A-108B will be described below with regard to FIGS. 2-7.

Figure 2:
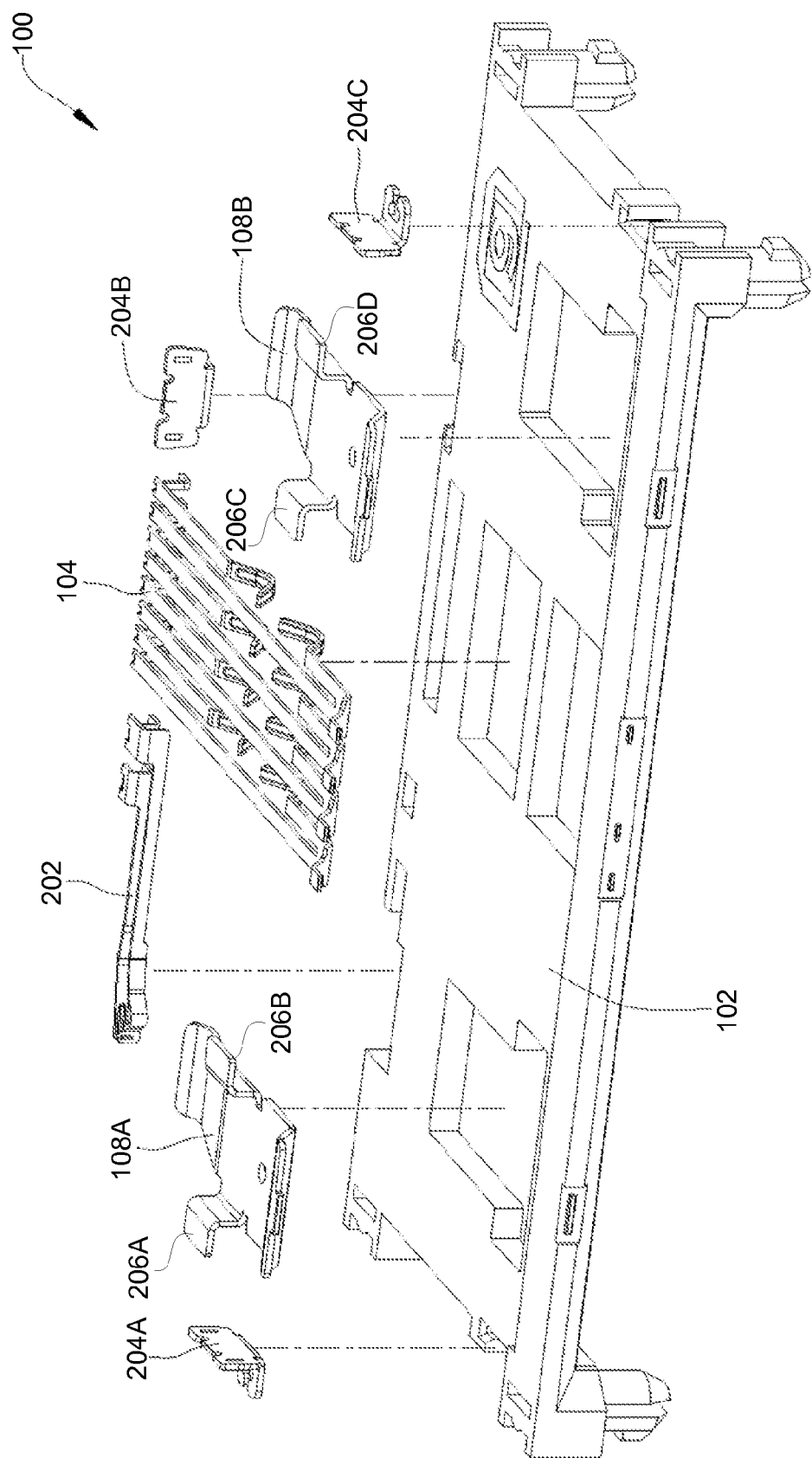
FIG. 2 is an exploded perspective diagram showing of the exemplary heat-dissipating card connector of FIG. 1.

FIG. 2 is an exploded perspective diagram showing additional aspects of an embodiment of a heat-dissipating card connector 100. As discussed briefly above, elements such as but not limited to the resilient conductive electronic contacts 104, heat conductive springs 108, and the switch contacts 202 may be attached to or molded into the body 102 of the card connector 100 during manufacturing. The switch contacts 202 may be utilized to detect the full insertion of a card into the card connector 100. As discussed above, engaging mechanisms or fasteners such as solder nails 204A-204C might be attached to or molded into the body 102 to attach the card connector 100 to a mounting surface, such as but not limited to a circuit board, platform, chassis or case.

As also shown in FIG. 2, each of the heat conductive springs 108A-108B includes one or more heat-directing elements. For instance, in the illustrated embodiment each of the heat conductive springs 108A-108B includes two heat-directing elements in the form of outwardly extending tabs 206 (the spring 108A includes the tabs 206A-206B and the spring 108B includes the tabs 206C-206D). As will be described in greater detail below, the tabs 206A-206B are configured to interface with a heat-dissipating surface such as a platform, chassis, or case in which the card connector 100 is mounted, when a card is inserted into the card connector 100. Heat generated by the card is transferred to and dissipated through the heat conductive springs 108A-108B, and to the mounting surface by way of the tabs 206A-206D. Additional details regarding the transferring and dissipating of heat through the heat conductive springs 206A-206D, as well as alternative embodiments of dissipating springs 108A-108B will be provided below.

FIGS. 3A-3B are top and side views, respectively, of an embodiment of a heat-dissipating card reader 300 with a card 302 inserted therein. In the illustrated embodiment, the card connector 100 has been mounted to a printed circuit board 304. The printed circuit board 304 has, in turn, been mounted in a chassis or case 306. Here, the chassis 306 is made of a heat-dissipating material. For instance, in this implementation the card connector 100 is mounted to a circuit board 304 suitable for use in a satellite television receiver. The circuit board 304 is then mounted to the chassis 306 of a satellite television receiver, such as a metal set-top box.

Figure 5A:
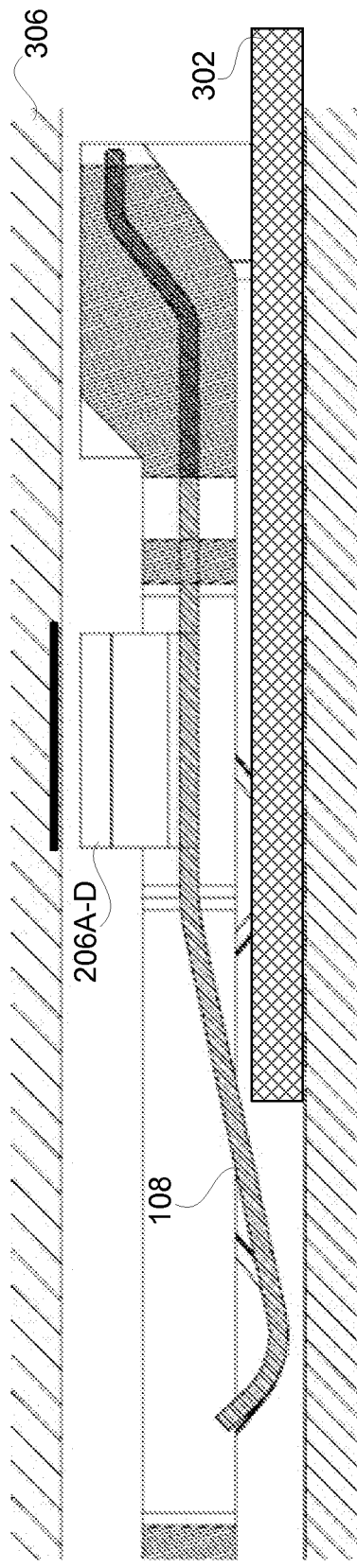
FIGS. 5A-5B are side views of an exemplary heat-dissipating card reader showing an exemplary heat-dissipating spring as a card is inserted into the card reader.

In the example shown in FIGS. 3A-3B, insertion of the card 302 into the card reader 300 has begun but the card 302 is not yet fully inserted. In particular, the card 302 has been inserted into the card reader 300 such that the leading end of the card 302 has only made slight contact with the heat conductive springs 108A-108B. Consequently, the tabs 206A-D have not yet made contact or interfaced with the case 306. FIG. 5A shows a close-up view of the card insertion depicted in FIG. 3B.

FIGS. 4A-4B are top and side views, respectively, of a heat-dissipating card reader 300 provided in an embodiment having a card 302 inserted therein. In the example shown in FIGS. 4A-4B, the card 302 has been fully inserted into the card reader 300. Consequently, the card 302 has engaged a card engaging portion (606 best shown in FIGS. 6A-6E) of the heat conductive springs 108A-B, thereby causing the tabs 206A-D of the heat conductive spring 108 to abut the case 306.

Figure 5B:
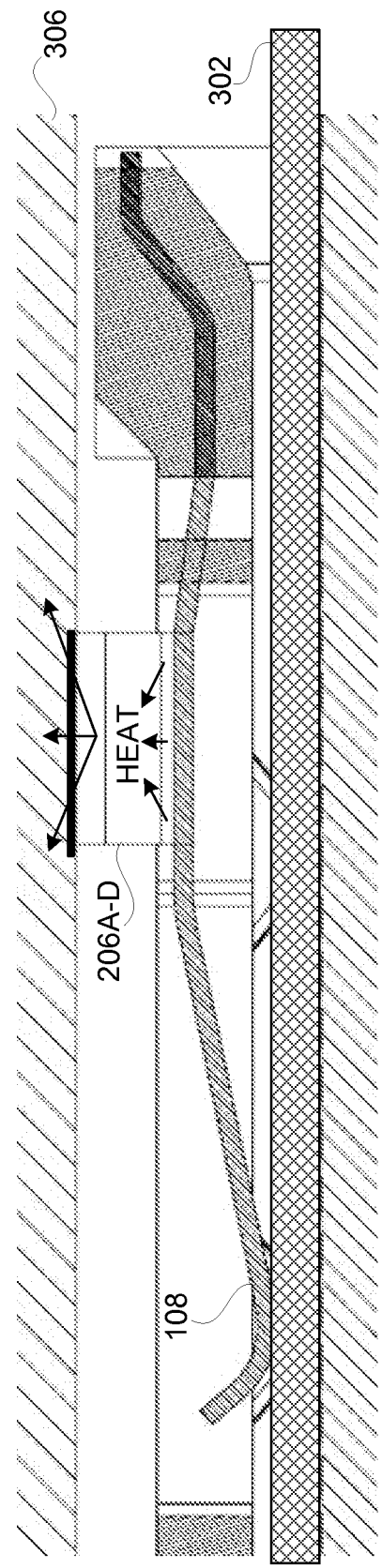

As mentioned herein, complete insertion of the card 302 into the card reader 300 will cause power to be applied to the electronics embedded in the card 302. Heat generated by the embedded electronics will then be transmitted to the heat conductive springs 108A-B and to the case 306 of the electronic device within which the card reader 300 is mounted. FIG. 5B shows a close-up view of the card insertion depicted in FIG. 4B.

As mentioned above with regard to FIGS. 3A-B, FIG. 5A is an enlarged view of the configuration and position of an exemplary heat conductive spring 108 comprising a tab 206 when a card 302 is partially inserted into a card reader 100 but not yet in contact with the heat conductive spring 108. Here, in the normally resting configuration and position of the illustrated heat conductive spring 108, the tab 206 is biased away from contacting the case 306. As mentioned above with regard to FIGS. 4A-B, FIG. 5B is an enlarged view of a configuration and position of an exemplary heat conductive spring 108 comprising a tab 206 when a card 302 is fully inserted into a card reader 300 and in contact with the heat conductive spring 108.

In the normally engaged configuration and position of the illustrated heat conductive spring 108, the tab 206 is placed in a position to directly or indirectly transfer heat to the case 306. In some embodiments, such as illustrated in FIG. 5B, the tab 206 abuts or is otherwise placed in direct contact with the case 306 such that the tab 206 directly transfers heat to the case 306. In other embodiments the tab 206 does not abut but interfaces or is otherwise placed substantially close to the case 306 such that the tab 206 radiates heat and thereby indirectly transfers heat to the case 306. As used herein, the term "transfer(s) heat" includes an element of the heat conductive spring 108 drawing heat from a card 302 and directly or indirectly transmitting the heat to a mounting surface that will dissipate the heat, such as a platform, chassis, case, combination thereof, and the like.

FIGS. 6A-6E are perspective views of an embodiment of a heat conductive spring 108 for use in an embodiment of a card connector 100 and a card reader 300. As discussed briefly above, the heat conductive spring 108 provided in one embodiment includes a body 600. The body 600 is connected to a body engaging portion 602 that is molded into the body 102 of the card connector 100. In alternative embodiments the body engaging portion 602 is attached to the body 102 with methods and fasteners well known by those skilled in the art, including mechanical and chemical fasteners and bonds. In still other embodiments, the body engaging portion 602 is molded into and extends through the body 102 such that a body engaging end 602A is positioned outside the body 102 and configured to transfer heat to a heat-dissipating surface such as a platform, chassis, case, combinations thereof, and the like.

The heat conductive spring 108 also includes a card engaging portion 606 that extends from the body 600 toward the location of the card 302 to engage a card inserted into the card reader 300. In the illustrated embodiment the card engaging portion 606 extends downward or inward, while in alternative embodiments the card engaging portion 606 extends upward or outward. In the context of the present disclosure the words "downward", "upward", "inward", "outward", and the like, and any of their derivatives are merely for the purpose of teaching a direction in relation to the body 600, and none are used in any sense that limits or restricts the structure of the heat conductive spring 108.

The heat conductive spring 108 also includes at least one heat directing element, illustrated here in the form of a heat directing tab 604. In one embodiment, the heat directing tab 604 extends upwardly and outwardly and has at least one surface in a plane substantially parallel to the chassis 306 when a card 302 is fully inserted into the card reader 300. In alternative embodiments the heat directing tab(s) 604 extends upwardly and inwardly and comprises various configurations and designs. In still alternative embodiments the body 600 is arched such that it extends upwardly and then downwardly and is itself the heat directing element that transfers heat to a heat-dissipating surface, such as a platform, chassis or case 306 when a card 302 is fully inserted into the card reader 300. In yet other embodiments, the heat directing element is in the form of a heat directing tab 604 extending from the card engaging portion end 606A.

It should be appreciated that the heat conductive spring 108 shown in FIGS. 6A-6E is only one example and that alternative configurations taught herein might be utilized. For instance, other configurations might be utilized that maximize the surface area of the heat conductive spring 108 that makes contact with the chassis 306. In this regard, the heat-dissipating portion 604 may be constructed much larger than shown in the FIGURES. Additionally, more or larger heat conductive springs 108 might also be utilized in other embodiments. Further, as taught herein, a heat directing element may take various forms and be located at various positions, the actual number and configuration of heat directing elements being merely a design choice.

The insertion of a card 302 into the card reader 300 will cause the card 302 to contact the card engaging portion 606 which, in turn, will cause the body 600 and the heat directing element 604 to move in the direction of the chassis 306. When the card 302 has been fully inserted, the heat directing element 604 will contact or interface the chassis 306, thereby allowing heat to be dissipated from the card 302 to the chassis 306. A heat transfer compound, such as thermal grease, may be applied to the heat directing element 604 of each heat conductive spring 108 to facilitate the heat transfer to the heat-dissipating surface.

Figure 6E:
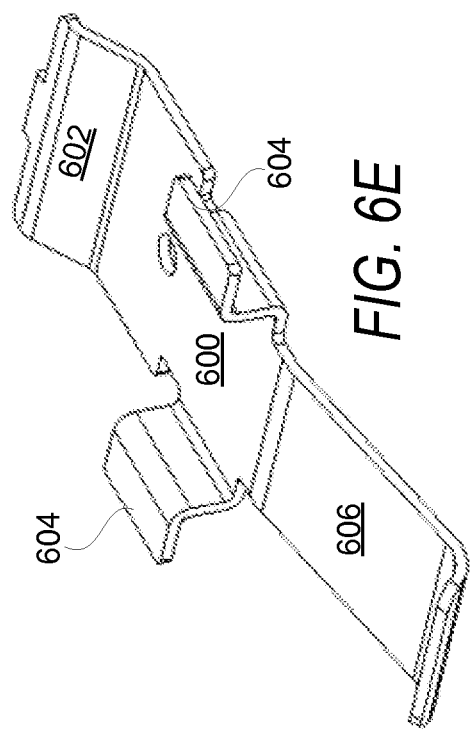
Figure 6F:
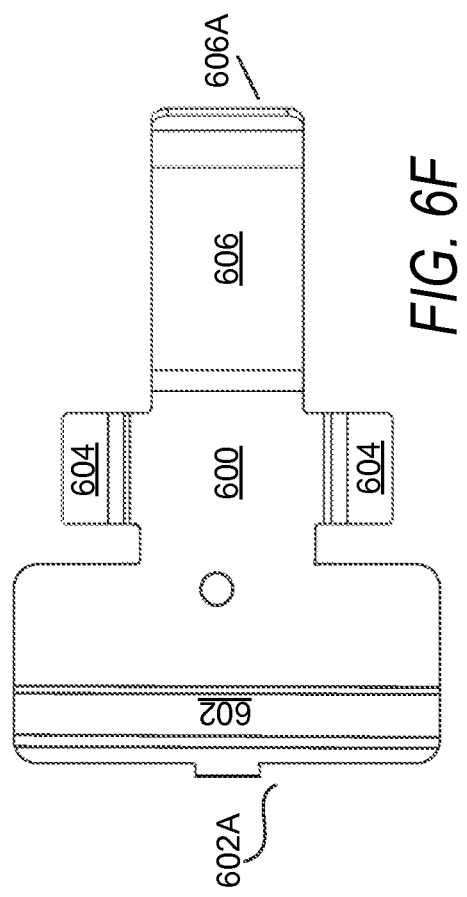

Another alternative embodiment, best shown in FIG. 6F, illustrates the widening of certain elements, such as but not limited to the body engaging portion 602. An advantage of providing a body engaging portion 602 that is perhaps wider than the card engaging portion 606, or that is perhaps wider than the heat directing tab(s) 604, is that a wider body engaging portion 602 may reduce the amount of heat-related distortion to the heat conductive spring 108. Similar advantages may be realized by widening the body 600, or the heat directing tab(s) 602, or the card engaging portion 606.

Figure 7:
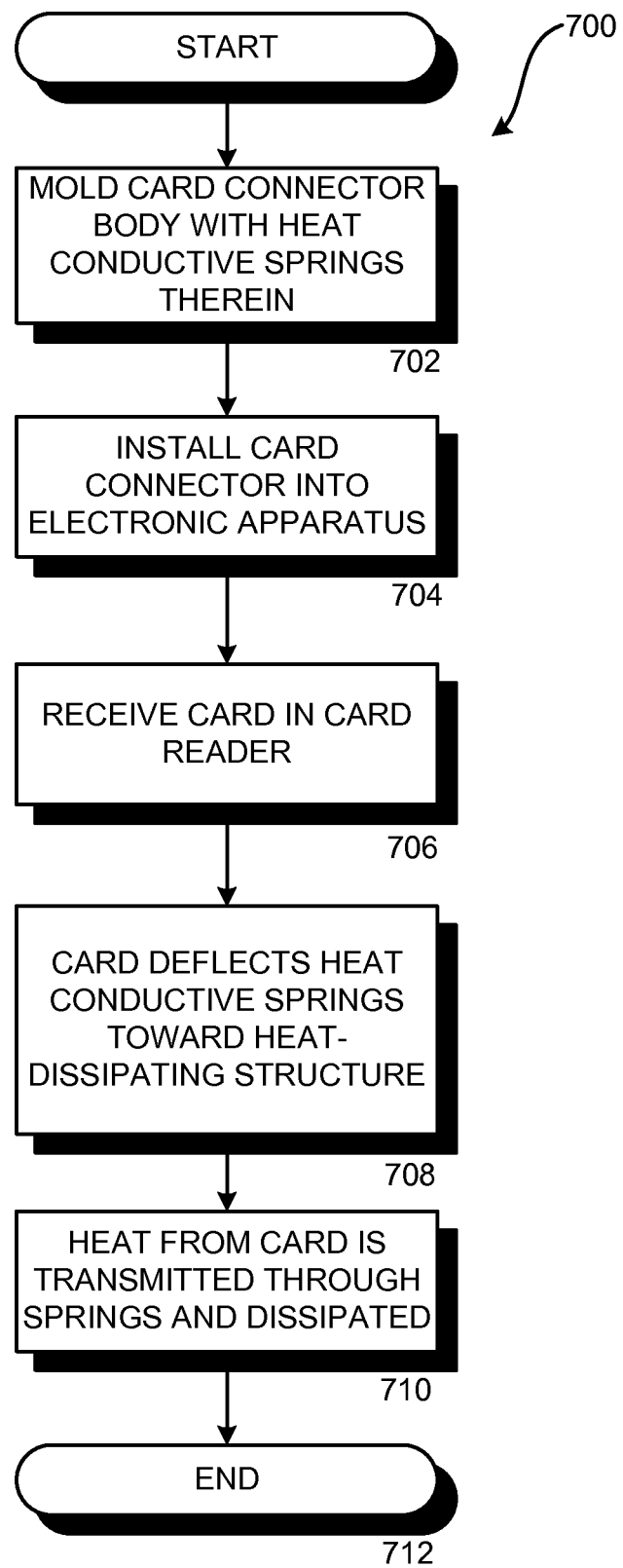
FIG. 7 is a logical flow diagram illustrating a process for manufacturing, assembling, and utilizing an exemplary heat-dissipating card reader.

FIG. 7 is a logical flow diagram illustrating a process 700 for manufacturing, assembling, and utilizing the heat-dissipating card reader 300 disclosed herein. It should be appreciated that the operations described herein can be implemented as a sequence of manufacturing steps, mechanical operations, and physical processes. The implementation may vary depending on the performance and other requirements of a particular manufacturing system or electronic device in which the card reader 300 disclosed herein is utilized. It should also be appreciated that more or fewer operations may be performed than shown in the figures and described herein. These operations may also be performed in parallel, or in a different order than those described herein.

The process 700 can begin with operation 702 where an appropriate manufacturing procedure is utilized to mold the body 102 of the card connector 100 with the heat conductive springs 108 molded therein. The other components shown in FIG. 2 might also be molded into the body 102 of the card connector 100. From operation 702, the routine 700 proceeds to operation 704, where the card connector 100 is installed into an electronic apparatus. As discussed above, the card connector 100 might be installed onto a circuit board utilized in a set-top box or other type of electronic device. Once the card connector 100 has been installed, the routine 700 proceeds to operation 706.

At operation 706, the card reader 300 receives a card 302. Once the card has been inserted into the card reader 300, the card 302 causes the heat conductive springs 108 to be deflected such that the chassis engaging portion 604 of the heat conductive springs contact or interface the chassis 306. This occurs at operation 708. At operation 710, heat generated by the card is dissipated by the heat conductive springs 108 and by the heat-dissipating structure 306. The routine 700 then continues to operation 712, where it ends.

Based on the foregoing, it should be appreciated that a heat-dissipating connector 100 and heat-dissipating card reader 300 has been disclosed herein. Although the subject matter presented herein has been described in language specific to systems, methodological acts, mechanical and physical operations, and manufacturing processes, it is to be understood that the invention disclosed herein is not necessarily limited to the specific features, acts, or media described herein. Rather, the specific features, acts and mediums are disclosed as example forms.

The subject matter described herein is provided by way of illustration for the purposes of teaching, suggesting, and describing, and not limiting. Alternatives to the illustrated embodiment are contemplated, described herein, and set forth in the claims. Various modifications and changes may be made to the subject matter described herein without following the example embodiments and applications illustrated and described, and without departing from the true spirit and scope of the present invention.

What is claimed is:

1. A heat-dissipating card reader, comprising:
    a connector body attached to a mounting surface of an electronic device, the connector body configured to receive a card comprising circuitry, and that is communicatively coupled to the electronic device;
    at least one electronic contact extending from the connector body that operationally engages the card circuitry when the card is inserted into the connector body; and,
    at least one heat conductive spring comprising:
        a body portion defining a plurality of sides which, in a first position, is at a first distance from and substantially parallel to the mounting surface;
        a body engaging portion defining a first edge and a first end, extending from a first side of the body portion at an obtuse angle along the first edge, and configured to be attached to the connector body at the first end;
        a card engaging portion defining a second edge and a second end, extending from a second side of the body portion at an obtuse angle along the second edge, and configured to contact the card at the second end; and,
        at least one heat-directing element defining a third edge and a third end, extending from a third side of the body portion along the third edge, and configured to contact a heat-dissipating structure.

2. The card reader of claim 1, further comprising a second heat conductive spring.

3. The card reader of claim 2, wherein the heat conductive springs are spaced apart such that each is located at opposite sides of the at least one electronic contact.

4. The card reader of claim 1, wherein the at least one heat-directing element is configured to contact the heat-dissipating structure in response to the second end contacting the card.

5. The card reader of claim 1, wherein the body portion, in response to the second end contacting the card, defines a second position which is a second and greater distance from the mounting surface.

6. The card reader of claim 5, wherein the second position orientates the body portion to an acute angle with respect to the mounting surface.

7. A heat-dissipating card connector, comprising:
a connector body mounted to and electronically linked to a printed circuit board of an electronic device, the connector body configured to receive at least a portion of a card comprising circuitry when the card is at least partially inserted into the electronic device;
at least one electronic contact attached to the connector body that operationally engages the card circuitry and electronically links the card circuitry to the printed circuit board when the card is inserted into the electronic device; and
at least one heat conductive spring comprising
a body portion defining a plurality of sides which, in a first position, is at a first distance from and substantially parallel to the mounting surface;
a body engaging portion defining a first edge and a first end, extending from a first side of the body portion at an obtuse angle along the first edge, and configured to be attached to the connector body at the first end;
a card engaging portion defining a second edge and a second end, extending from a second side of the body portion at an obtuse angle along the second edge, and configured to contact the card at the second end;
at least one heat-directing element defining a third edge and a third end, extending from a third side of the body portion along the third edge, and configured to contact a heat-dissipating structure; and,
wherein the at least one heat-directing element is configured to contact the heat-dissipating structure in response to the second end contacting the card while the body portion, in response to the second end contacting the card, defines a second position which is a second and greater distance from the mounting surface and the second position orientates the body portion to an acute angle with respect to the mounting surface.

8. The heat-dissipating card connector of claim 7, further comprising a second heat conductive spring.

9. The heat-dissipating card connector of claim 8, wherein the heat conductive springs are spaced apart such that each is located at opposite sides of the at least one electronic contact.

10. A method of constructing a heat-dissipating card connector for use
with a card reader, comprising:
providing a connector body configured to receive a card comprising circuitry, be attached to a mounting surface, and be electronically linked to an electronic device;
attaching at least one electronic contact to the connector body that operationally engages the card circuitry when the card is inserted into the electronic device; and
attaching at least one heat conductive spring to the connector body, the heat conductive spring comprising
a body portion defining a plurality of sides which, in a first position, is at a first distance from and substantially parallel to the mounting surface;
a body engaging portion defining a first edge and a first end, extending from a first side of the body portion at an obtuse angle along the first edge, and configured to be attached to the connector body at the first end;
a card engaging portion defining a second edge and a second end, extending from a second side of the body portion at an obtuse angle along the second edge, and configured to contact the card at the second end;
at least one heat-directing element defining a third edge and a third end, extending from a third side of the body portion along the third edge, and configured to contact a heat-dissipating structure; and
wherein the at least one heat-directing element is configured to contact the heat-dissipating structure in response to the second end contacting the card while the body portion, in response to the second end contacting the card, defines a second position which is a second and greater distance from the mounting surface and the second position orientates the body portion to an acute angle with respect to the mounting surface.

11. The method of claim 10, further comprising electronically linking to an electronic device a card reader comprising the connector body.

* * * * *